United States Patent
Cheek et al.

(10) Patent No.: US 6,242,330 B1
(45) Date of Patent: *Jun. 5, 2001

(54) PROCESS FOR BREAKING SILICIDE STRINGERS EXTENDING BETWEEN SILICIDE AREAS OF DIFFERENT ACTIVE REGIONS

(75) Inventors: Jon Cheek, Round Rock; Derick J. Wristers; Fred Hause, both of Austin, all of TX (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/994,200

(22) Filed: Dec. 19, 1997

(51) Int. Cl.[7] .................. H01L 21/44; H01L 21/225; H01L 21/335

(52) U.S. Cl. ................... 438/586; 438/592; 438/621; 438/647

(58) Field of Search .................... 438/368, 647, 438/586, 621, 305, 297, 296, 303; 257/536

(56) References Cited

U.S. PATENT DOCUMENTS

| | | | |
|---|---|---|---|
| 4,478,678 | * 10/1984 | Watanabe | 156/643 |
| 4,528,066 | * 7/1985 | Merkling, Jr. et al. | 156/643 |
| 4,608,118 | * 8/1986 | Curtis et al. | 156/643 |
| 5,063,168 | * 11/1991 | Vora | 438/368 |
| 5,160,407 | * 11/1992 | Latchford et al. | 156/656 |
| 5,172,211 | * 12/1992 | Godinho et al. | 257/536 |
| 5,352,631 | * 10/1994 | Sitaram et al. | 438/300 |
| 5,449,631 | * 9/1995 | Giewont et al. | 438/303 |
| 5,573,980 | * 11/1996 | Yoo | 438/586 |
| 5,593,924 | * 1/1997 | Apte et al. | 438/647 |
| 5,607,884 | * 3/1997 | Byun | 438/297 |
| 5,648,287 | * 7/1997 | Tsai et al. | 438/305 |
| 5,834,368 | * 11/1998 | Kawaguchi et al. | 438/621 |
| 5,880,033 | * 3/1999 | Tsai | 438/710 |
| 6,004,878 | * 12/1999 | Thomas et al. | 438/655 |

* cited by examiner

*Primary Examiner*—Olik Chaudhuri
*Assistant Examiner*—Wai-Sing Louie

(57) ABSTRACT

A process for breaking silicide stringers extending between silicide regions of different active regions on a semiconductor device is provided. Consistent with an exemplary fabrication process, two adjacent silicon active regions are formed on a substrate and a metal layer is formed over the two adjacent silicon active regions. The metal layer is then reacted with the silicon active regions to form a metal silicide on each silicon active region. This silicide reaction also forms silicide stringers extending from each silicon active region. Finally, at least part of each silicide stringer is removed. During the formation of the silicide stringers at least one silicide stringer may be formed which bridges the metal silicide over one of the silicon regions and the metal silicide over the other silicon region. In such circumstances, the removal process may, for example, break the silicide stringer and electrically decouple the two silicon regions. The two silicon active regions may, for example, be a gate electrode and an adjacet source/drain region. As another example, the two adjacent active regions may be two nearby polysilicon lines.

27 Claims, 2 Drawing Sheets

PROCESS FOR BREAKING SILICIDE STRINGERS EXTENDING BETWEEN SILICIDE AREAS OF DIFFERENT ACTIVE REGIONS

FIELD OF THE INVENTION

The present invention is generally directed to semiconductor devices and, more particularly, to a process for breaking silicide stringers extending between silicide areas of different active regions on a semiconductor device.

BACKGROUND OF THE INVENTION

Over the last few decades, the electronics industry has undergone a revolution by the use of semiconductor technology to fabricate small, highly integrated electronic regions. The most common semiconductor technology presently used is silicon-based. A large variety of semiconductor devices have been manufactured having various applications in numerous disciplines. Such silicon-based semiconductor devices often include metal-oxide-semiconductor (MOS) transistors, complimentary MOS (CMOS) transistors, bipolar transistors, BiCMOS transistors, etc.

Each of these semiconductor devices generally include a semiconductor substrate on which a number of transistors are formed. The particular structure of a given transistor can vary between transistor types. For example, MOS transistors generally include source and drain regions and a gate electrode which modulates current between the source and drain regions. Bipolar transistors generally include a base a collector, and an emitter. In addition to the active regions (e.g., source regions, drain regions, gate electrodes, bases, emitters, collectors, etc.) of the transistors, both bipolar and MOS transistors often include polysilicon lines, active regions which typically run over regions of the substrate, such as field oxide regions, and interconnect various portions of the region.

The various active regions on a semiconductor device are typically interconnected by metal lines. In most cases, a silicide is formed over some or all of the active regions in order to facilitate contact between the active regions and subsequent metal lines. The silicide areas also serve to reduce the sheet resistance of the active regions. Silicide areas are typically formed by depositing a layer of metal, such as tungsten, cobalt or titanium, over the substrate and annealing the wafer, typically in a two-step process. During the annealing process, the deposited metal reacts with underlying silicon and forms a metal silicidation layer.

It is typically desirable to minimize the resistivity of the silicide areas. The resistivity of the silicide areas generally depends upon the temperature at which the silicide reaction occurs as well as the type of metal used to form the silicide areas. Generally, the temperature of the reaction is a first order variable in the resultant resistivity. Higher silicide reaction temperatures result in silicide areas having lower resistivity. In conventional silicidation techniques, using elevated temperatures can however result in the formation of deleterious silicide stringers, which in some instances can extend between the silicide areas of adjacent active regions and electrically couple the active regions.

SUMMARY OF THE INVENTION

The present invention provides a process for breaking silicide stringers extending between silicide regions of different active regions on a semiconductor device. A semiconductor fabrication process, in accordance with one embodiment of the invention, includes forming two adjacent silicon active regions on a substrate and forming a metal layer over the two adjacent silicon active regions. The metal layer is then reacted with the silicon active regions to form a metal silicide on each silicon active region. This silicide reaction also forms one or more silicide stringers which extend from each silicon active region. Finally, at least part of each silicide stringer is removed. During the formation of the silicide stringers at least one silicide stringer may be formed which bridges the metal silicide over one of the silicon regions and the metal silicide over the other silicon region. In such circumstances, the removal process may, for example, break the silicide stringer and electrically decouple the two silicon active regions. The two silicon active regions may, for example, be a gate electrode and an adjacent source/drain region. As another example, the two adjacent active regions may be two nearby polysilicon lines.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
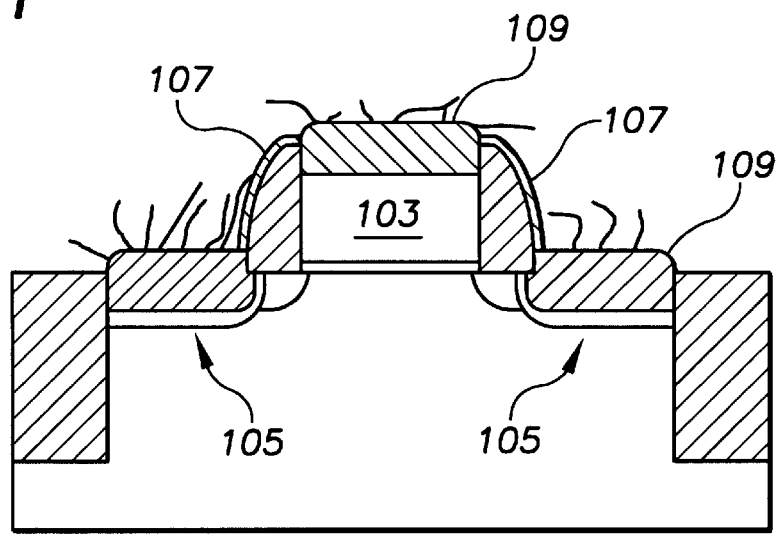
FIGS. 1 and 2 each illustrate an exemplary bridging of two active regions by silicide stringers.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention is believed to be applicable to a number of semiconductor devices, including MOS, CMOS, BiCMOS, and bipolar devices, which use silicide areas on active regions. The invention has been found to be particularly advantageous in applications where it is desirable to form titanium silicide areas. While the present invention is not so limited, an appreciation of various aspects of the invention is best gained through a discussion of various application examples of processes used to form such semiconductor devices.

As discussed above, semiconductor devices typically include silicon active regions (e.g., source/drain regions, emitters, bases, collectors, gate electrodes, polysilicon lines, etc.) on which silicide areas are formed. The silicide areas are typically formed to facilitate contact to the active region and to lower the resistivity of the contact. The resistivity of the silicide areas generally depends upon the temperature at which the silicide reaction occurs as well as the type of metal used to form the silicide area.

The current trend is to form silicide areas using titanium. Titanium silicide provides a low resistive material and a good ohmic contact to the silicided active regions. However, it has been found that one drawback to using elevated temperature (e.g., above 700° C.) with titanium is that titanium silicide stringers form on the titanium silicide regions and, in some cases, the stringers bridge neighboring silicide areas thereby shorting the active regions associated with the silicide areas and causing the region to malfunction. In particular, it has been found that problems presented by silicide stringers become more pronounced as the feature size of the device is reduced. For example, at polysilicon line/gate electrode widths of 0.25 microns or less, silicide stringers which bridge nearby active regions often occur.

Figure 2:
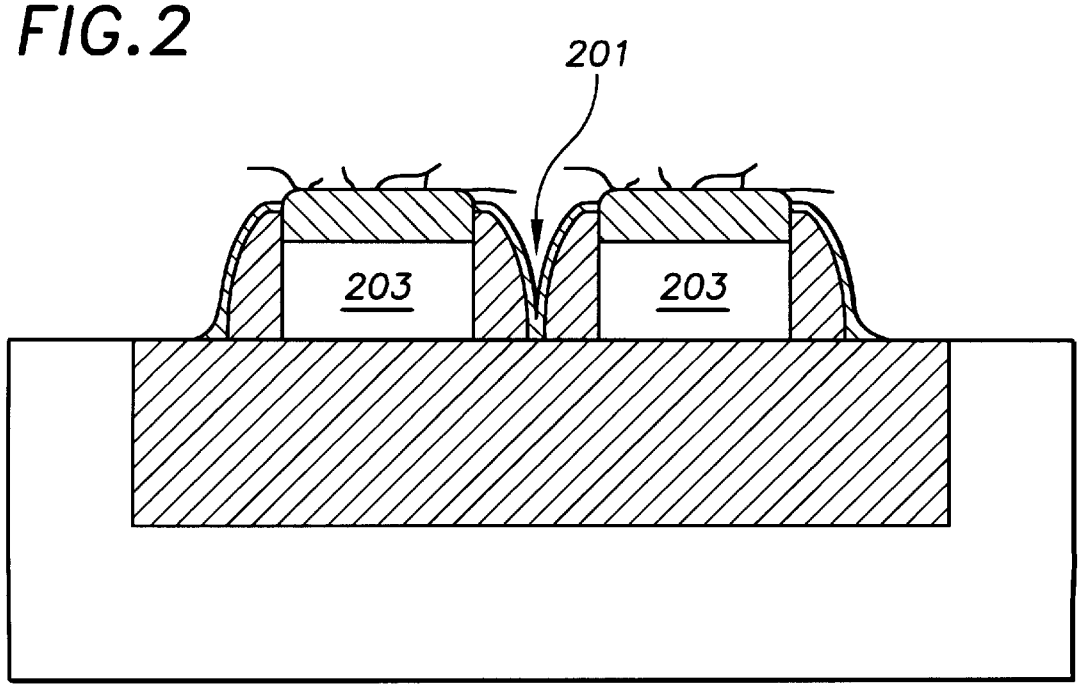

By way of example, FIG. 1 illustrates an exemplary MOS transistor having a polysilicon gate electrode 103 and an adjacent source/drain region 105 which are bridged by a silicide stringer 107 extending between the silicide areas 109 on the gate electrode 103 and the source/drain region 105. The problems presented by titanium silicide stringers are however not limited to transistor structures. For example, when nearby polysilicon lines are silicided using titanium, titanium silicide stringers which bridge the silicide area of one polysilicon line and the silicide region of an adjacent polysilicon line can form. An exemplary illustration of a titanium silicide stringer 201 bridging and electrically coupling nearby polysilicon lines 203 is illustrated in FIG. 2.

The formation of titanium silicide stringers generally results from the migration of silicon (e.g., from a polysilicon line, a gate electrode, and/or a portion of the silicon substrate in which an active region is formed) into the titanium metal layer. When annealed, the migrated silicon reacts with the titanium and forms titanium silicide stringers which extend from the body of the titanium silicide area. Titanium silicide stringers can also formed from the reduction of $SiO_2$ by titanium. When unreacted portions of the titanium are removed, the silicide area along with any titanium silicide stringers are left intact. The present invention provides a process for breaking titanium silicide stringers which may form between adjacent or nearby silicon active regions. This, for example, allows higher temperature silicide reactions and can provide lower resistivity silicide areas, especially at small feature sizes.

While FIGS. 1 and 2 above and the exemplary embodiment discussed below illustrate the use of the invention with MOS transistors and their active regions (i.e., gate electrodes and source/drain regions), the invention is not so limited. The invention may be applied with equal force to other types of semiconductor devices, such as bipolar devices. Moreover, while the exemplary embodiment below generally illustrate the use of the invention with titanium silicide areas, it should be appreciated that the present invention is not so limited. Other types of metal silicides (and their associated metals) which when formed can form stringers bridging adjacent active regions are intended to be covered by the present invention.

Figure 3A:
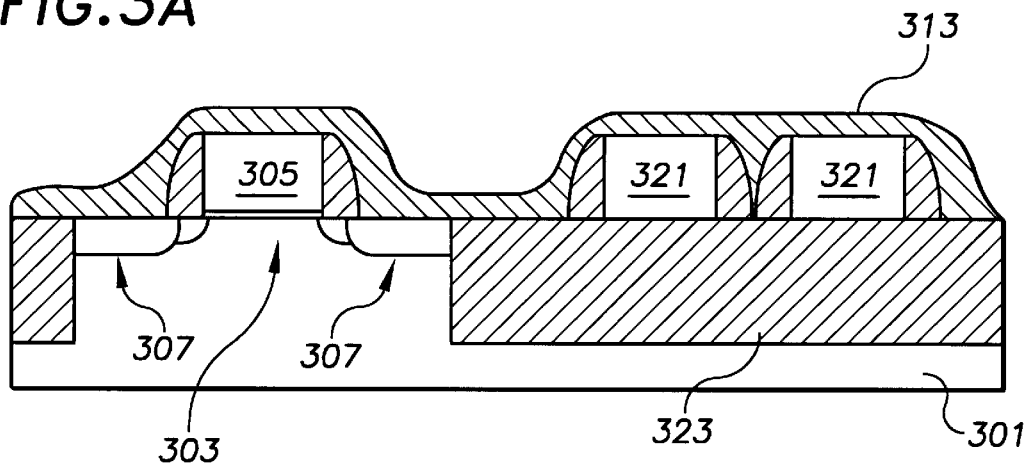
FIGS. 3A–3C illustrate an exemplary fabrication process in accordance with an embodiment of the invention.
Figure 3B:
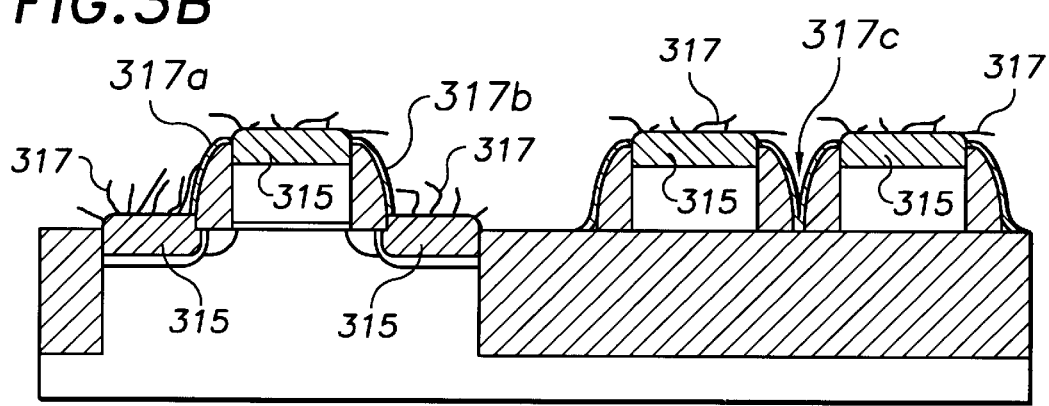
Figure 3C:
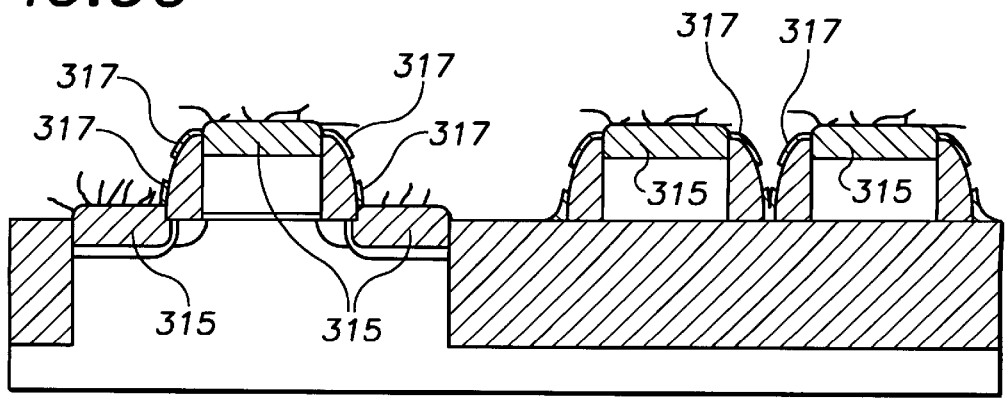

FIGS. 3A–3C illustrate an exemplary process for breaking silicide stringers extending between adjacent silicon active regions. In accordance with this exemplary embodiment, one or more transistors (only one of which is shown) are formed over a silicon substrate 301. The transistor 303 generally includes a polysilicon gate electrode 305 and source/drain regions 307 in the substrate 301 adjacent the polysilicon gate electrode 3053. In this particular embodiment, another area of the substrate is shown in which polysilicon lines 321 are formed over an isolation region 323. Sidewall spacers may be formed on sidewalls of the gate electrode 303 and polysilicon lines 321. The transistor 303 as well as the polysilicon lines 321 may be formed using any of a number of well-known techniques. In particular, the gate electrode 305 and polysilicon lines 321 may be formed at reduced widths, for example, between 0.1 and 0.25 microns.

A layer of metal 313 is formed over the substrate 301. The resultant structure is illustrated in FIG. 3A. The metal layer 313 will be used to react with exposed silicon areas (e.g., exposed surfaces of the gate electrode 305, polysilicon lines 321 and active regions 307) to form metal silicide areas over each of these active regions. The metal layer 313 may be formed from a number of different metals including, in particular, titanium, using well-known deposition techniques.

The substrate 301 is annealed to react the metal layer 313 with exposed silicon regions and form silicide areas 315 on each of the active regions (e.g., source/drains 307, gate electrode 305, and polysilicon lines 321). Unreacted portions of the metal layer 313 are then removed using, for example well-known etching techniques. Advantageously, the anneal used to form the silicide areas 315 may be performed at higher temperatures than conventional techniques. For example, when using titanium, the silicide reaction may be performed at temperatures of 700 to 750° C. or more. At these high temperatures, titanium silicide stringers 317 which extend from the silicide areas 315 are typically formed. In some cases, as illustrated in FIG. 3B, some of these titanium silicide stringers 317, such as stringers 317a–c, can bridge the metal silicide areas 315 of adjacent active regions.

Following the removal of unreacted metal layer portions the substrate 301 is annealed again, at typically an even higher temperature, in order to further reduce the resistivity of the silicide areas 315. The resultant structure is illustrated in FIG. 3B. The temperature of the second anneal may also be increased above conventional second step anneals as the formation of any silicide stringers 317 which bridge adjacent active regions will be broken, as discussed further below. For example, when using titanium, this second anneal may be performed at temperatures of 800 to 850° C. or more.

The thickness of the silicide areas 315 can vary depending on the application. As will be discussed below, a portion of each silicide area 315 may be removed during subsequent processing. Accordingly, the thickness of the silicide areas 315 may be selected to take into consideration this subsequent removal. Titanium silicide area thickness ranging from about 300 to 1000 angstroms would be suitable for many applications.

Portions of the titanium silicide stringer 317 are removed, as illustrated in FIG. 3C. This removal process generally breaks any silicide stringers (e.g., stringer 317a–c) which may bridge the silicide areas 315 of adjacent active regions. This removal process may also slightly reduce the width of any spacers on the sidewalls of the gate electrode 305 as well as the thickness of the silicide areas 315. This, process for removing portions of the titanium silicide stringers 317 may be performed using a number of different techniques. In one particular embodiment, highly isotropic etching techniques, such as plasma etching techniques, are used to etch portions of the stringers and break any stringers which bridge different active regions. Following this step, fabrication may continue with conventional fabrication steps, such as interconnect formation and so forth, to form the ultimate region structure.

Using the above process, low resistivity silicide area may be formed on active regions of a semiconductor device without leaving any deleterious silicide stringers. In particular, semiconductor devices having gate electrode and/ or polysilicon line widths of about 0.25 microns or less (e.g., 0.25, 0.20, 0.15, and 0.1 microns) can be formed with titanium silicide areas having resistivity areas ranging from about 1 to 20 ohms/cm$^2$ and any associated titanium silicide stringers may be at least partially etched to prevent shorting of adjacent active regions. The lower resistivity silicide areas can, for example, advantageously increase the operating speeds of the resultant semiconductor device.

As noted above, the present invention is applicable to fabrication of a number of different regions using silicide areas on silicon active regions. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and regions.

What is claimed is:

1. A process of fabricating a semiconductor device, comprising:
   forming a silicon active region on a substrate;
   forming a metal layer over the silicon active region;
   reacting the metal layer with the silicon active region to form a metal silicide on the silicon active region, wherein the reaction forms one or more deleterious filamentary silicide stringers extending from the silicon active region and then removing unreacted portions of the metal layer; and
   separately removing at least part of each deleterious filamentary silicide stringer.

2. The process of claim 1, wherein reacting the metal layer with the silicon active region includes annealing the substrate a first temperature from at least about 700° C. to form the metal silicide; and
   further including annealing the substrate at a second temperature from at least about 800° C. after removing the unreacted portions of the metal layer.

3. The process of claim 2, wherein the metal layer is formed from titanium.

4. The process of claim 1, wherein removing at least part of each silicide stringer includes etching each silicide stringer.

5. The process of claim 4, wherein the etching is performed using a highly isotropic etch process.

6. The process of claim 2, wherein the metal silicide has a resistivity range from about 1 to 20 ohms/cm$^2$.

7. The process of claim 2, wherein the metal silicide has a resistivity ranging from about 5 to 6 ohms/cm$^2$.

8. The process of claim 1, wherein the step of forming a silicon active region includes forming at least two silicon active regions.

9. The process of claim 8, wherein one of the two silicon active regions is a gate electrode and the other region is a source/drain region adjacent the gate electrode.

10. The process of claim 8, wherein the metal layer is formed from a single metal.

11. The process of claim 8, wherein reacting the metal layer with the silicon active regions includes annealing the substrate at a first temperature from at least about 700° C. to form the metal silicide; and
    further including annealing the substrate at a second temperature from at least about 800° C. to reduce the resistivity of the metal silicide.

12. The process of claim 8, wherein removing at least part of each silicide stringer includes etching each silicide stringer.

13. The process of claim 12, wherein the etching is performed using a highly isotropic etch process.

14. The process of claim 11, wherein the metal silicide has a resistivity range from about 1 to 20 ohms/cm$^2$.

15. The process of claim 11, wherein the metal silicide has a resistivity ranging from about 5 to 6 ohms/cm$^2$.

16. The process of claim 8, wherein each of the two silicon active regions are polysilicon lines.

17. A process of fabricating a semiconductor device, comprising:
    forming a silicon active region on a substrate;
    forming a metal layer over the silicon active region, wherein the layer is formed from a single metal material;
    annealing the substrate at a first temperature that ranges from about 700 to 750° C. or more to form the metal silicide, wherein the annealing forms one or more deleterious filamentary silicide stringers extending from the silicon active region;
    removing unreacted portions of the metal layer;
    annealing the substrate at a second temperature that ranges from about 800 to 850° C. or more after removing the unreacted portions of the metal layer; and
    removing via a highly isotropic etch process at least part of each deleterious filamentary silicide stringer after annealing at the second temperature.

18. The process of claim 17, wherein the formation of the silicon active region includes forming two adjacent silicon active regions on the substrate.

19. The process of claim 18, wherein the two silicon active regions are two adjacent polysilicon regions formed on the substrate.

20. A process of fabricating a semiconductor device, comprising:
    forming a silicon active region on a substrate;
    forming a titanium layer over the silicon active region;
    annealing the substrate at a first temperature that ranges from about 700 to 750° C. or more to form the metal silicide, wherein the annealing forms one or more deleterious filamentary silicide stringers extending from the silicon active region;
    removing unreacted portions of the metal layer;
    annealing the substrate at a second temperature that ranges from about 800 to 850° C. or more to reduce the resistivity of the metal silicide after removing the unreacted portions of the metal layer; and
    removing via a plasma etch process at least part of each silicide stringer after annealing at the second temperature.

21. A process of fabricating a semiconductor device, comprising in sequence:
    forming at least two adjacent silicon active regions on a substrate with at least one spacer formed therebetween;
    forming a metal layer over the silicon active regions and the at least one spacer;
    reacting the metal layer with the silicon active regions to form a metal suicide on the silicon active regions, wherein the reaction forms one or more deleterious filamentary silicide stringers extending from the silicon active regions and then removing unreacted portions of the metal layer; and separately removing at least part of each deleterious filamentary silicide stringer, such that there is no electrical contact between the silicon active regions caused by the silicide stringers.

22. The process of claim 21, wherein reacting the metal layer with the silicon active region includes annealing the substrate at a first temperature from at least about 700° C. to form the metal silicide; and further including annealing the substrate at a second temperature from at least about 800° C. after removing the unreacted portions of the metal layer.

23. The process of claim 22, wherein the metal layer is formed from a single metal.

24. The process of claim 22, wherein the metal layer is formed from titanium.

25. The process of claim 24, wherein the silicon active regions are polysilicon lines.

26. A process of fabricating a semiconductor device, comprising:

forming at least two adjacent silicon active regions on a substrate with at least one spacer formed therebetween;

forming a metal layer over the silicon active region, wherein the layer is formed from a single metal material;

annealing the substrate at a first temperature that ranges from about 700 to 750° C. or more to form the metal silicide, wherein the annealing forms one or more deleterious filamentary silicide stringers extending between the silicon active regions;

removing unreacted portions of the metal layer;

annealing the substrate at a second temperature that ranges from about 800 to 850° C. or more after removing the unreacted portions of the metal layer, thereby breaking the silicide stringers extending between the silicon active regions; and removing via a highly isotropic etch process at least part of each deleterious filamentary silicide stringer after annealing at the second temperature.

27. A process of fabricating a semiconductor device, comprising:

forming at least two adjacent silicon active regions on a substrate with at least one spacer formed therebetween;

forming a titanium layer over the silicon active region;

annealing the substrate at a first temperature that ranges from about 700 to 750° C. or more to form the metal silicide, wherein the annealing forms one or more deleterious filamentary silicide stringers extending between the silicon active regions;

removing unreacted portions of the metal layer;

annealing the substrate at a second temperature that ranges from about 800 to 850° C. or more to reduce the resistivity of the metal silicide and to break the silicide stringers extending between the silicon active regions after removing the unreacted portions of the metal layer; and removing via a plasma etch process at least part of each silicide stringer after annealing the second temperature.

* * * * *

UNITED STATES PATENT AND TRADEMARK OFFICE
CERTIFICATE OF CORRECTION

PATENT NO.    : 6,242,330 B1
DATED         : June 5, 2001
INVENTOR(S)   : Cheek et al.

It is certified that error appears in the above-identified patent and that said Letters Patent is hereby corrected as shown below:

Column 3,
Line 61, "3053" should read -- 305 --.

Column 7,
Line 14, "claim 22" should read -- claim 23 --.

Signed and Sealed this

Twenty-fifth Day of February, 2003

JAMES E. ROGAN
*Director of the United States Patent and Trademark Office*